United States Patent
Takamura

(10) Patent No.: US 8,421,340 B2
(45) Date of Patent: Apr. 16, 2013

(54) ORGANIC LIGHT EMITTING DEVICE

(75) Inventor: Makoto Takamura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 381 days.

(21) Appl. No.: 12/809,542

(22) PCT Filed: Dec. 18, 2008

(86) PCT No.: PCT/JP2008/073073
§ 371 (c)(1),
(2), (4) Date: Jun. 18, 2010

(87) PCT Pub. No.: WO2009/081838
PCT Pub. Date: Jul. 2, 2009

(65) Prior Publication Data
US 2010/0264430 A1    Oct. 21, 2010

(30) Foreign Application Priority Data
Dec. 21, 2007  (JP) ................................ P2007-330938

(51) Int. Cl.
*H01L 51/00* (2006.01)
(52) U.S. Cl.
USPC ................................ 313/504; 257/99; 257/88
(58) Field of Classification Search .......... 313/498–512; 257/99, 88
See application file for complete search history.

(56) References Cited

U.S. PATENT DOCUMENTS

| 6,707,247 B2 * | 3/2004 | Murano ......................... 313/501 |
| 2006/0227431 A1 * | 10/2006 | Yoon et al. .................... 359/708 |
| 2007/0200497 A1 | 8/2007 | Matsudate et al. |

FOREIGN PATENT DOCUMENTS

| JP | 40-034673 Y1 | 12/1965 |
| JP | 47-000497 Y1 | 1/1972 |
| JP | 07-130472 A | 5/1995 |
| JP | 11-273855 A | 10/1999 |
| JP | 2001-257081 A | 9/2001 |
| JP | 2005-345935 A | 12/2005 |
| JP | 2006-047964 A | 2/2006 |
| JP | 2007-066709 A | 3/2007 |
| JP | 2007-073902 A | 3/2007 |
| JP | 2007-232802 A | 9/2007 |

* cited by examiner

*Primary Examiner* — Karabi Guharay
(74) *Attorney, Agent, or Firm* — Rabin & Berdo, P.C.

(57) ABSTRACT

Provided is an organic light emitting device having a simple structure and enabling cost reduction. An organic light emitting device 30 of the present invention includes: an organic light emitting element 20; an electrode substrate (11, 12) including a pin connection hole (14, 15) with which the organic light emitting element 20 is fixed and electrically connected; and a lead pin (9, 10) having a clamp portion (9a, 10a) and an insertion portion (9b, 10b), the clamp portion (9a, 10a) clamping a peripheral portion of the organic light emitting element 20, the insertion portion (9b, 10b) being fitted into the pin connection hole (14, 15) to thereby connect the organic light emitting element 20 to the electrode substrate (11, 12).

8 Claims, 9 Drawing Sheets (a)

(b)

ORGANIC LIGHT EMITTING DEVICE

TECHNICAL FIELD

The present invention relates to an organic light emitting device, and particularly relates to an organic light emitting device having a simple structure and enabling cost reduction.

BACKGROUND ART

Recently, lighting devices which use organic EL (EL: Electroluminescence) elements as organic light emitting elements are under development for practical use. Conventionally, organic EL lighting panels have been known in each of which an organic EL element is connected to a power source by using a flexible film or a wiring member as a lead wire.

FIG. 9 shows an example of a conventional organic EL lighting panel. In the conventional organic EL lighting panel 100, an organic EL layer sandwiched between an anode and a cathode is disposed on a substrate. The anode is connected to an anode lead-out electrode 101, whereas the cathode is connected to a cathode lead-out electrode 102. A flexible cable is provided on the anode lead-out electrode 101 and the cathode lead-out electrode 102, which are electrically connected to terminals of the flexible cable (for example, refer to Patent Document 1).

As described above, in the conventional organic EL lighting panel, a power input terminal is provided on each of any of four edges of a quadrilateral panel or all of the four edges as in the case of a display panel. A lead wire is led out from each power input terminal by use of a flexible cable. Patent Document 1: Japanese Patent Application Publication No. 2007-066709

DISCLOSURE OF THE INVENTION

Problems to be Solved by the Invention

However, the above-described conventional technique has a problem of complicated structure and resultant high cost, because a connector or a terminal table for connecting the lead wire, and a part for fixing the panel are additionally required. Moreover, the above-described conventional technique has a problem that the complicated structure results in a complicated operation for detachment and attachment of the panel, making it difficult to replace the panel with another.

An object of the present invention is to provide an organic light emitting device having a simple structure and enabling cost reduction.

Means for Solving the Problems

In order to achieve the above object, an invention according to claim 1 is an organic light emitting device including: an organic light emitting element; an electrode substrate including a pin connection hole with which the organic light emitting element is fixed and electrically connected; and a lead pin having a clamp portion and an insertion portion, the clamp portion clamping a peripheral portion of the organic light emitting element, the insertion portion being fitted into the pin connection hole to thereby connect the organic light emitting element to the electrode substrate.

An invention according to claim 2 is the organic light emitting device according to claim 1, characterized in that the organic light emitting element is detachably attached to the pin connection hole with the insertion portion.

An invention according to claim 3 is the organic light emitting device according to any one of claims 1 and 2, characterized in that the lead pin is made of an electrically conductive elastic body.

An invention according to claim 4 is the organic light emitting device according to any one of claims 1 to 3, characterized in that: the organic light emitting element has a substantially rectangular shape in a plan view; and the lead pin is disposed on each of at least two edges or each of at least two vertices of the rectangular shape.

An invention according to claim 5 is the organic light emitting device according to any one of claims 1 to 4, further including a heat conductive member disposed between the organic light emitting element and the electrode substrate.

An invention according to claim 6 is the organic light emitting device according to any one of claims 1 to 5, characterized in that: a plurality of the electrode substrates are joined to each other side by side with insulating layers interposed therebetween; and a plurality of the organic light emitting elements are disposed adjacent to each other on main surfaces of the thus joined electrode substrates.

An invention according to claim 6 is the organic light emitting device according to claim 6, further including: a light guide member disposed above a boundary region between the organic light emitting elements; and a light-diffusing sheet disposed to cover the organic light emitting elements with the light guide member interposed therebetween.

EFFECTS OF THE INVENTION

The organic light emitting device of the present invention makes it possible to provide an organic light emitting device having a simple structure and enabling cost reduction.

EXPLANATION OF THE REFERENCE NUMERALS

Figure 1:
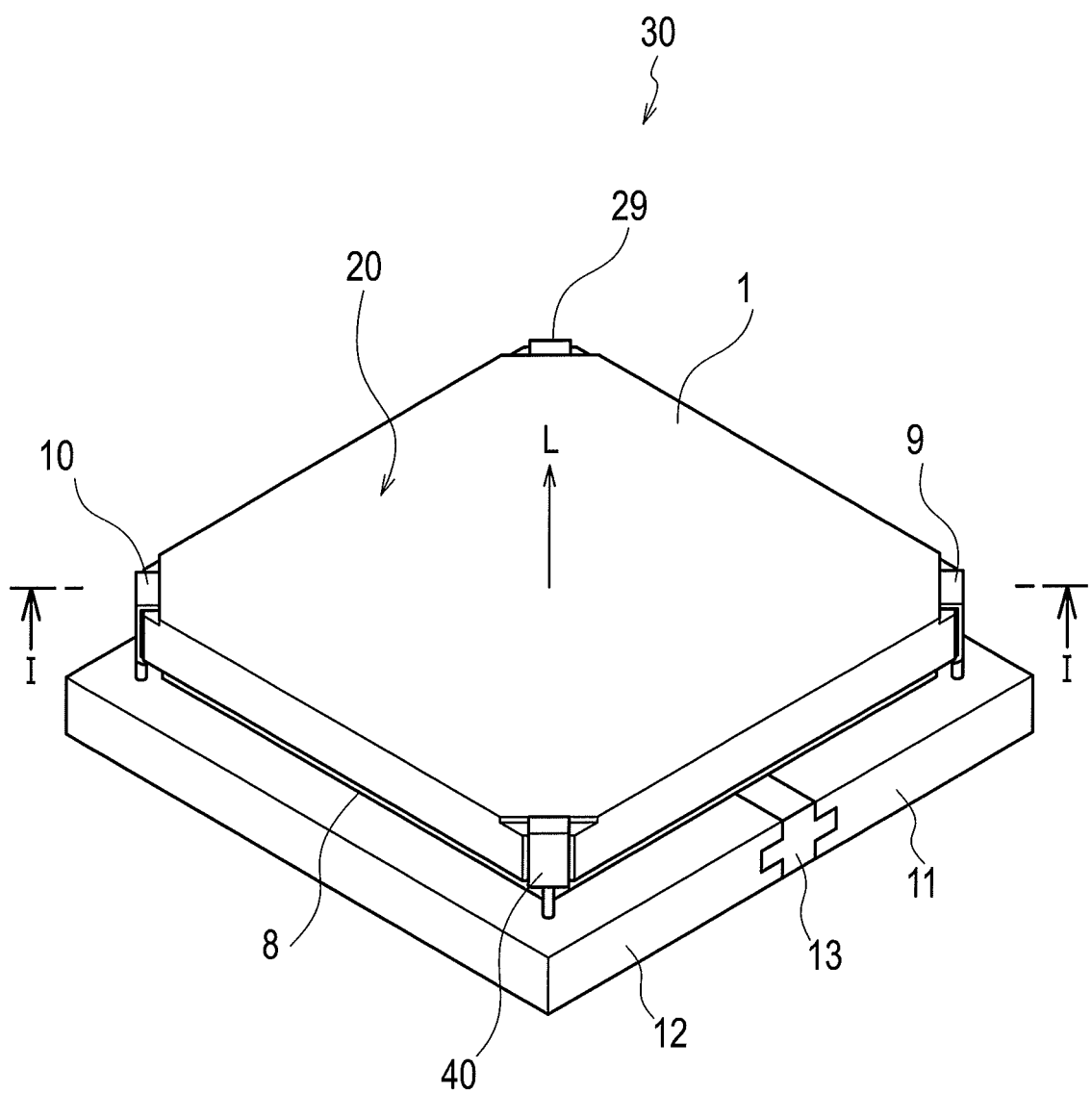
FIG. 1 is a schematic perspective view of an organic light emitting device according to a first embodiment of the present invention.

1 . . . substrate
2 . . . anode layer
3 . . . organic light emitting layer
4 . . . cathode layer
5 . . . anode terminal
6 . . . cathode terminal
7 . . . insulating layer
8 . . . sealing plate
9 . . . anode side lead pin
10 . . . cathode side lead pin
11 . . . anode electrode substrate
12 . . . cathode electrode substrate
13 . . . insulating layer
20 . . . organic light emitting element
30 . . . organic light emitting device

BEST MODES FOR CARRYING OUT THE INVENTION

Hereinafter, organic light emitting devices according to embodiments of the present invention are described with reference to the drawings. In the following description of the drawings, same or similar reference numerals denote same or similar elements and portions. However, it should be noted that the drawings are schematic and different from actual ones. Moreover, it should also be noted that the drawings include portions each having dimensional relationships and ratios different from one drawing to another.

First Embodiment

Structure of Organic Light Emitting Device

Figure 2:
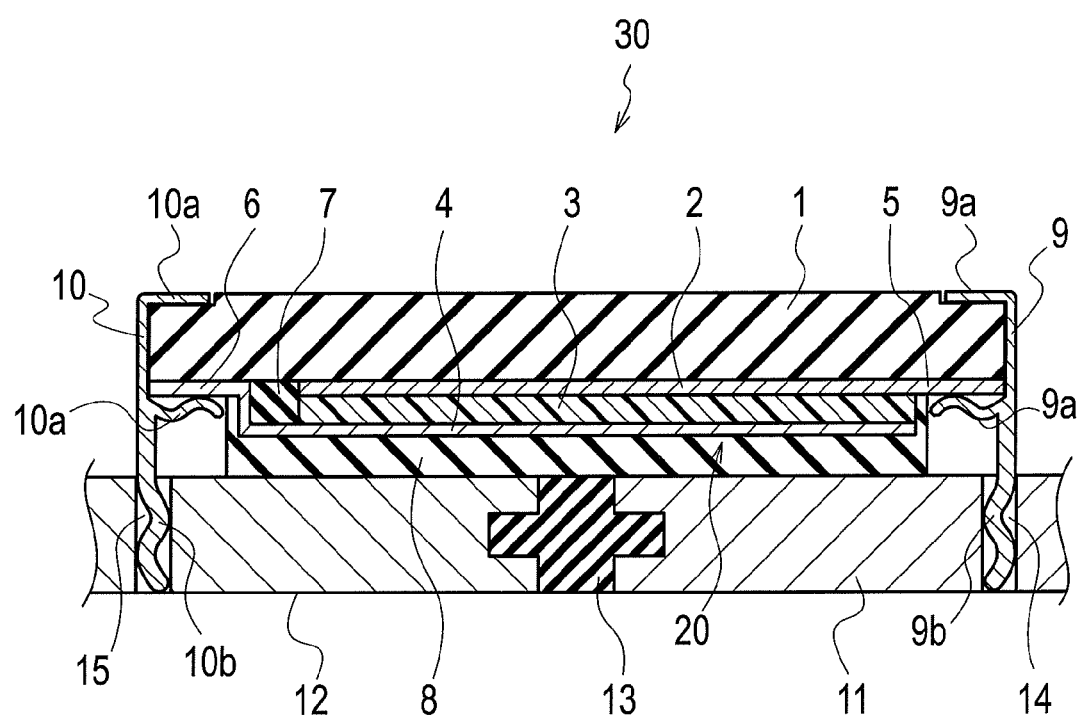
FIG. 2 is a sectional structural view taken along the I-I line in FIG. 1.

As shown in FIGS. 1 and 2, an organic light emitting device according to a first embodiment of the present invention includes an organic light emitting element 20, an electrode substrate (11, 12) and a lead pin (9, 10). The electrode substrate (11, 12) includes a pin connection hole (14, 15) with which the organic light emitting element 20 is fixed and electrically connected. The lead pin (9, 10) has a clamp portion (9a, 10a) and an insertion portion (9b, 10b). The clamp portion (9a, 10a) clamps peripheral portions of the organic light emitting element 20. The insertion portion (9b, 10b) is fitted into the pin connection hole (14, 15), to thereby connect the organic light emitting element 20 to the electrode substrate (11, 12).

The organic light emitting element 20 is formed by sequentially stacking an anode layer 2, an organic light emitting layer 3, and a cathode layer 4 on a substrate 1. The anode layer 2 and the cathode layer 4 are insulated from each other with an insulating layer 7 interposed therebetween. An anode terminal 5 disposed as an extension of the anode layer 2 is formed in the anode layer 2, whereas a cathode terminal 6 disposed as an extension of the cathode layer 4 is formed in the cathode layer 4.

Moreover, a surface of the organic light emitting element 20, except for the anode terminal 5 and the cathode terminal 6, is sealed with a sealing plate 8, the surface facing the cathode layer 4.

The lead pin (9, 10) includes an anode side lead pin 9 and a cathode side lead pin 10.

The anode side lead pin 9 includes a clamp portion 9a and an insertion portion 9b. The clamp portion 9a clamps an end portion of the organic light emitting element 20 with the anode terminal 5 interposed therebetween. The insertion portion 9b is fitted into a later described anode side pin connection hole 14 to thereby fix the organic light emitting element 20. Likewise, the cathode side lead pin 10 includes a clamp portion 10a and an insertion portion 10b. The clamp portion 10a clamps another end portion of the organic light emitting element 20 with the cathode terminal 6 interposed therebetween. The insertion portion 10b is fitted into a later described cathode side pin connection hole 15 to thereby fix the organic light emitting element 20.

A Lead pin (29, 40) includes an anode side lead pin 29 and a cathode side lead pin 40.

The anode side lead pin 29 and cathode side lead pin 40 have the same structures as the above-described anode side lead pin 9 and cathode side lead pin 10, and overlapping description thereof is omitted.

The electrode substrate (11, 12) includes an anode electrode substrate 11 and a cathode electrode substrate 12.

The anode electrode substrate 11 and the cathode electrode substrate 12 are insulated from each other with an insulating layer 13 interposed therebetween. An anode side pin connection hole 14 is formed in the anode electrode substrate 11, whereas a cathode side pin connection hole 15 is formed in the cathode electrode substrate 12.

The insertion portion 9b of the anode side lead pin 9 is fitted into the anode side pin connection hole 14, and the insertion portion 10b of the cathode side lead pin 10 is fitted into the cathode side pin connection hole 15. Thus, the organic light emitting element 20 is attached onto the electrode substrate (11, 12). Each of the insertion portion 9b and the insertion portion 10b has a bent shape, and is fitted into the pin connection hole (14, 15) in an attachable and detachable manner, while being in contact with inner walls of the pin connection hole (14, 15) in a spring like manner.

Since this organic light emitting device 30 has a structure with which light L is taken out through a side of the substrate 1, a light-transmissive transparent substrate such as a glass substrate is used as the substrate 1.

Preferably, the substrate 1 has a substantially rectangular shape in a plan view. The lead pin (9, 10) is disposed on at least two edges or at least two vertices of the rectangular shape.

As in the case of the substrate 1, the anode layer 2 is formed of a light-transmissive transparent electrode of ITO (indium-tin oxide) having a thickness of approximately 150 nm to approximately 160 nm.

In the organic light emitting layer 3, a hole-transport layer, a light emitting portion, and an electron-transport layer are sequentially stacked from the substrate 1 side.

The hole-transport layer is a layer for smoothly transporting holes injected through the anode layer 2 to the light emitting portion. For example, the hole-transport layer is made of NPB (N,N-di(naphthyl)-N,N-diphenyl-benzidene) and has a thickness of approximately 60 nm.

The electron-transport layer is a layer for smoothly transporting electrons injected through the cathode layer 4 to the light emitting portion. For example, the electron-transport layer is made of $Alq_3$ (an aluminum quinolinol complex) and has a thickness of approximately 35 nm.

The light emitting portion is a portion for emitting light by having the injected holes and electrons recombined therein. For example, the light emitting portion is made of $Alq_3$ doped with a coumarin compound ($C_{545}T$) at a concentration of approximately 1%, and has a thickness of approximately 30 nm, the coumarin compound ($C_{545}T$) being a light emitting species.

Note that the organic light emitting layer 3 may be constructed of layers, such as a hole-injection layer and an electron-injection layer, other than the above-described hole-transport layer and electron-transport layer.

The cathode layer 4 is made of aluminum, and has a thickness of approximately 150 nm, for example.

The sealing plate 8 protects and seals the anode layer 2, the cathode layer 4, and the organic light emitting layer 3. Examples of a material of the sealing plate 8 include glass, metals such as stainless steel (SUS) and copper, ceramics, and the like.

The lead pins (9, 10) are pins for detachably attaching the substrate 1 to the electrode substrate (11, 12), and for electrically connecting the organic light emitting element 20 to the electrode substrate (11, 12).

Regarding a material of the lead pins, the lead pins (9, 10) are preferably made of a metal having a spring property. Examples of the material include oxygen-free copper, brass, phosphor bronze and silver-plated copper. Among these materials, phosphor bronze is preferable.

The electrode substrate (11, 12) is a substrate for supplying power to the organic light emitting element 20 therethrough, and for fixing the substrate 1 thereto with the lead pin (9, 10). Moreover, the electrode substrate (11, 12) has a function as heat sink plates for dissipating heat generated by the organic light emitting element 20.

A material of the electrode substrate (11, 12) is preferably, for example, a metal having a favorable thermal conductivity, and a low electrical resistance. Preferably, the material is copper, aluminum or the like. The metal has, for example, a thickness of 1 to 10 mm.

(Operational Principle)

The operational principle of the organic light emitting device according to the first embodiment of the present invention is as follows.

First, a certain voltage is applied across the anode layer 2 and the cathode layer 4 from the anode electrode substrate 11 and the cathode electrode substrate 12 through the anode terminal 5 and the cathode terminal 6 of the organic light emitting element 20. As a result, the anode layer 2 injects holes into the light emitting portion through the hole-transport layer, and the cathode layer 4 injects electrons into the light emitting portion through the electron-transport layer. Then, the holes and electrons injected into the light emitting portion are recombined with each other to emit the light L. The emitted light L exits to the outside through the substrate 1.

(Production Method)

Figure 3:
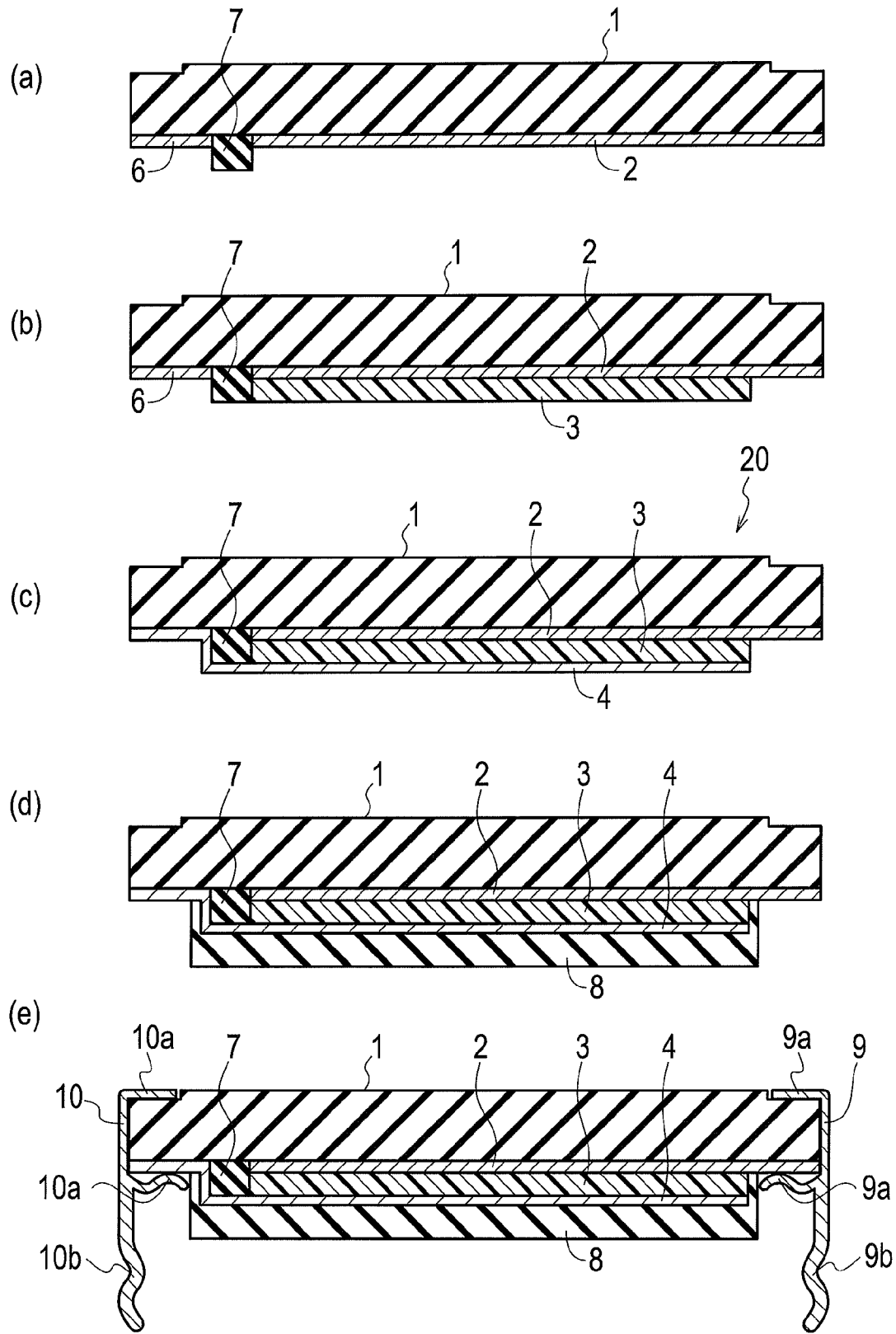
FIG. 3 is a view illustrating a method of producing the organic light emitting device according to the first embodiment of the present invention, where: (a) is a view showing a step of forming an anode layer 2, a cathode terminal 6, and further an insulating layer 7 on a substrate 1; (b) is a view showing a step of forming an organic light emitting layer 3; (c) is a view showing a step of forming a cathode layer 4; (d) is a view showing a step of forming a sealing plate 8; and (e) is a view showing a step of attaching a lead pin (9, 10).
Figure 4:
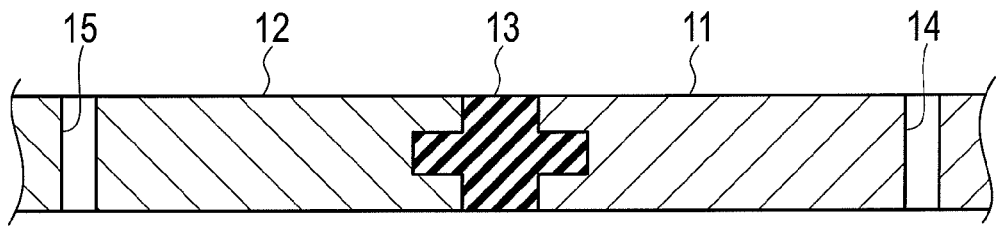
FIG. 4 is a view illustrating a method of producing the organic light emitting device according to the first embodiment of the present invention, where: (f) is a view showing a step of bonding an anode substrate 11 and a cathode substrate 12 to each other with an insulating layer 13 interposed therebetween, and forming a pin connection hole (14, 15); and (g) is a view showing a step of attaching an organic light emitting element 20 to an electrode substrate (11, 12).
Figure 4:
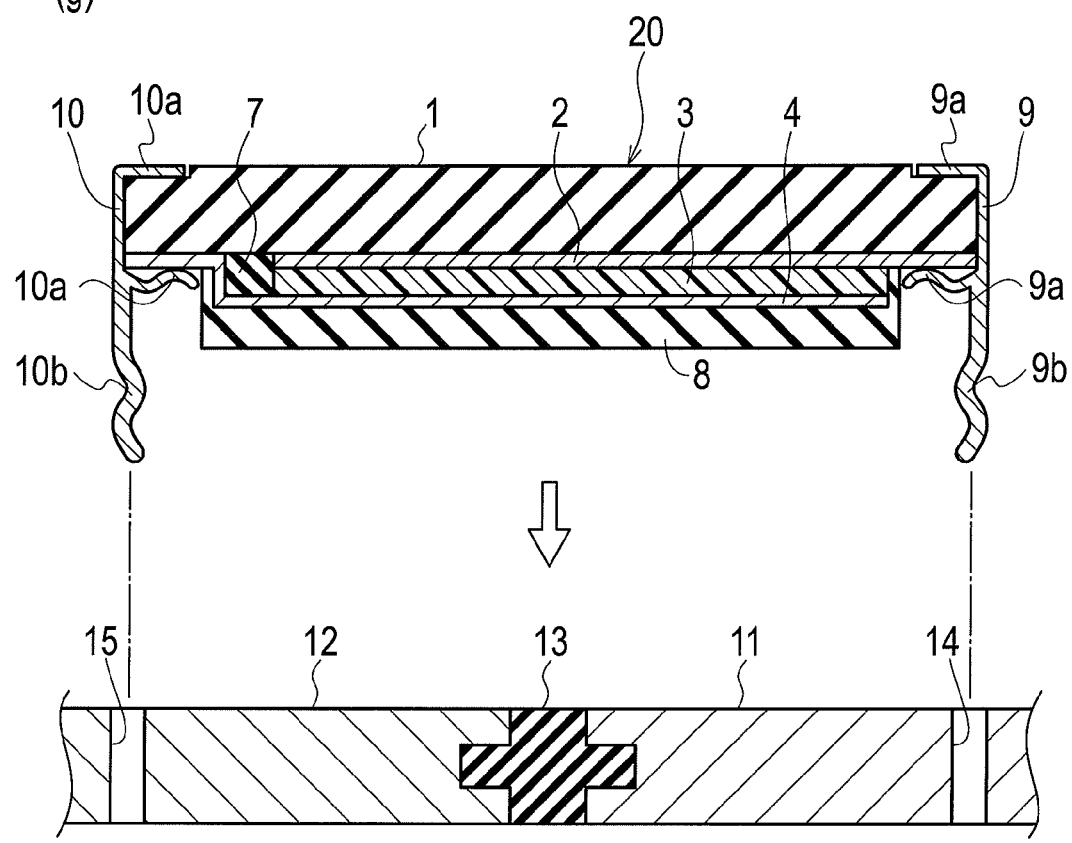

FIGS. 3 and 4 are views illustrating a method of producing the organic light emitting device according to the first embodiment of the present invention.

The method of producing the organic light emitting device according to the first embodiment of the present invention includes the steps of: forming the organic light emitting element 20 by forming the organic light emitting layer 3 on the substrate 1; clamping the end portions of the organic light emitting element 20 with the lead pin (9, 10); forming the pin connection hole (14, 15) in the electrode substrate (11, 12); and connecting the organic light emitting element 20 to the electrode substrate (11, 12) with the lead pin (9, 10) and the pin connection hole (14, 15).

Hereinafter the production steps are described in detail.

(a) First, as shown in FIG. 3(a), the anode layer 2 and the cathode terminal 6, which are on the substrate 1, are patterned and etched. Then, the insulating layer 7 is formed between the anode layer 2 and the cathode terminal 6.

(b) Next, as shown in FIG. 3(b), the hole-transport layer, the light emitting portion, and the electron-transport layer are sequentially formed in a vacuum vapor-deposition apparatus. Thus, the organic light emitting layer 3 is formed.

(c) Next, as shown in FIG. 3(c), the cathode layer 4 is formed by sputtering or the like. Thus, the organic light emitting element 20 including the anode layer 2, the organic light emitting layer 3 and the cathode layer 4 are formed.

(d) Next, as shown in FIG. 3(d), the sealing plate 8 is formed by sputtering or the like on the surface of the organic light emitting element 20, except for the anode terminal 5 and on the cathode terminal 6.

(e) Next, as shown in FIG. 3(e), the lead pin (9, 10) is fixed to the end portions of the organic light emitting element 20 in such a manner that the clamp portion (9a, 10a) clamps the end portions with the anode terminal 5 and the cathode terminal 6 interposed therebetween.

(f) Next, as shown in FIG. 4(f), the pin connection hole (14, 15) is formed by etching or the like in the electrode substrate (11, 12) obtained by bonding the two electrode substrates to each other with the insulating layer 13 interposed therebetween.

(g) Finally, as shown in FIG. 4(g), the insertion portion (9b, 10b) is fitted into the pin connection hole (14, 15), whereby the organic light emitting element 20 is fixed to the electrode substrate (11, 12). Thus, the organic light emitting device 30 shown in FIG. 2 is completed.

Such an organic light emitting device 30 is characterized by having the structure, which enables connection of the organic light emitting element 20 to a power source, and fixation thereof to the electrode substrate (11, 12) also serving as heat sink plates, simply by inserting the lead pin (9, 10) into the pin connection hole (14, 15) of the electrode substrate (11, 12).

As a result, the size of the organic light emitting device 30 can be reduced, and the productivity and yield thereof are improved. As a result, cost reduction can be achieved.

Moreover, since the connection is established with the pins, the structure is simple and cost-saving, and it facilitates operation for replacing the organic light emitting element 20 with another.

Moreover, since the heat sink plates and electrode plates are integrated into the same plate, the structure is simple.

The organic light emitting device according to the first embodiment of the present invention makes it possible to provide an organic light emitting device 30 having a simple structure and enabling cost reduction.

Second Embodiment

Figure 5:
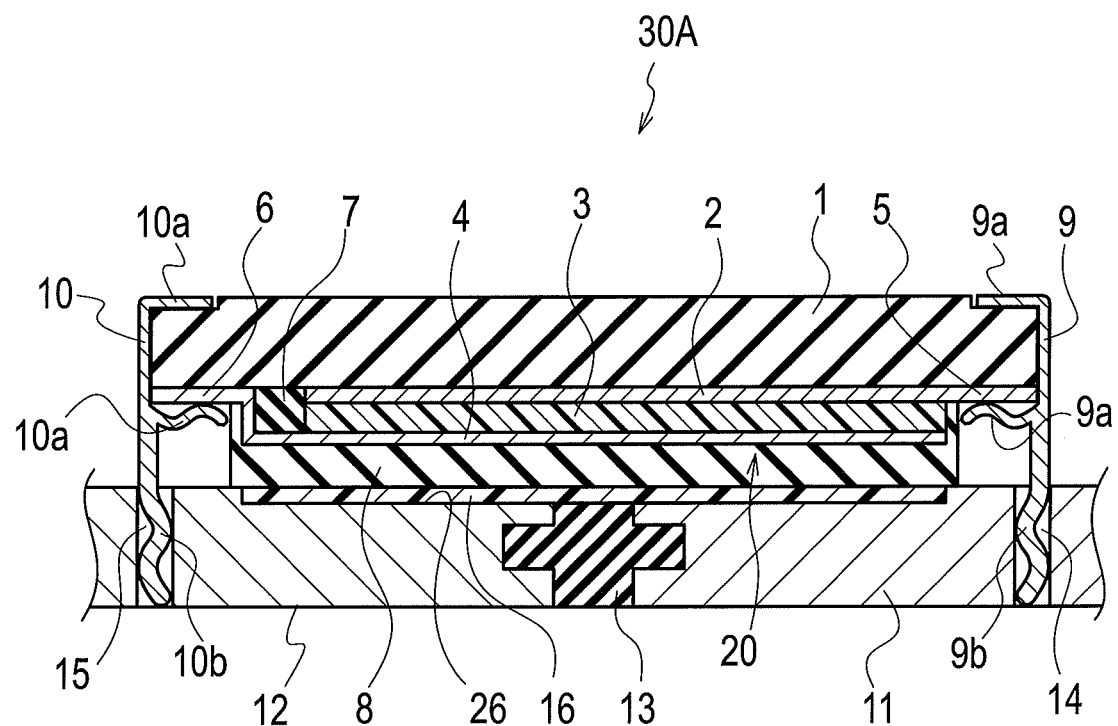
FIG. 5 is a sectional structural view of an organic light emitting device according to a second embodiment of the present invention.

As shown in FIG. 5, an organic light emitting device according to a second embodiment of the present invention includes the organic light emitting element 20, the electrode substrate (11, 12) and the lead pin (9, 10). The electrode substrate (11, 12) includes the pin connection hole (14, 15) with which the organic light emitting element 20 is fixed and electrically connected. The lead pin (9, 10) has the clamp portion (9a, 10a) and the insertion portion (9b, 10b). The clamp portion (9a, 10a) clamps peripheral portions of the organic light emitting element 20. The insertion portion (9b, 10b) is fitted into the pin connection hole (14, 15), to thereby connect the organic light emitting element 20 to the electrode substrate (11, 12). Here, the organic light emitting device further includes a heat conductive member 16 disposed between the organic light emitting element 20 and the electrode substrate (11, 12). Arrangement of other components is the same as that in the first embodiment, and description thereof is omitted.

Preferably, the heat conductive member 16 is disposed all over a concave portion 26 formed in a surface of the electrode substrate (11, 12), and the heat conductive member 16 is brought into close contact with a sealing plate 8.

A material of the heat conductive member 16 is not particularly limited, as long as the material has heat conductivity. Examples of the material include epoxy-based resin, silicone-based resin, and the like. Preferably, the material is silicone-based resin, more preferably, silicone grease.

A method of producing the organic light emitting device according to the second embodiment differs from the production method of the first embodiment in terms of a method of forming the heat conductive member 16. Since the other points are the same as those of the first embodiment, overlapping description is omitted.

In the method of producing the organic light emitting device according to the second embodiment, an organic light emitting device 30A can be produced as follows. Specifically, the concave portion 26 is formed in the surfaces of the electrode substrate (11, 12) and the insulating layer 13 by etching or the like. Then, the heat conductive member 16 is formed all over the concave portions 26 by application or the like.

The heat conductive member 16 is disposed between the organic light emitting element 20 and the electrode substrate (11, 12). Hence, heat generated by the organic light emitting element 20 can be efficiently conducted through the heat conductive member 16 to the electrode substrate (11, 12), and can be dissipated favorably.

The organic light emitting device according to the second embodiment of the present invention makes it possible to provide the organic light emitting device 30A having a simple structure and enabling cost reduction.

Third Embodiment

Figure 6:
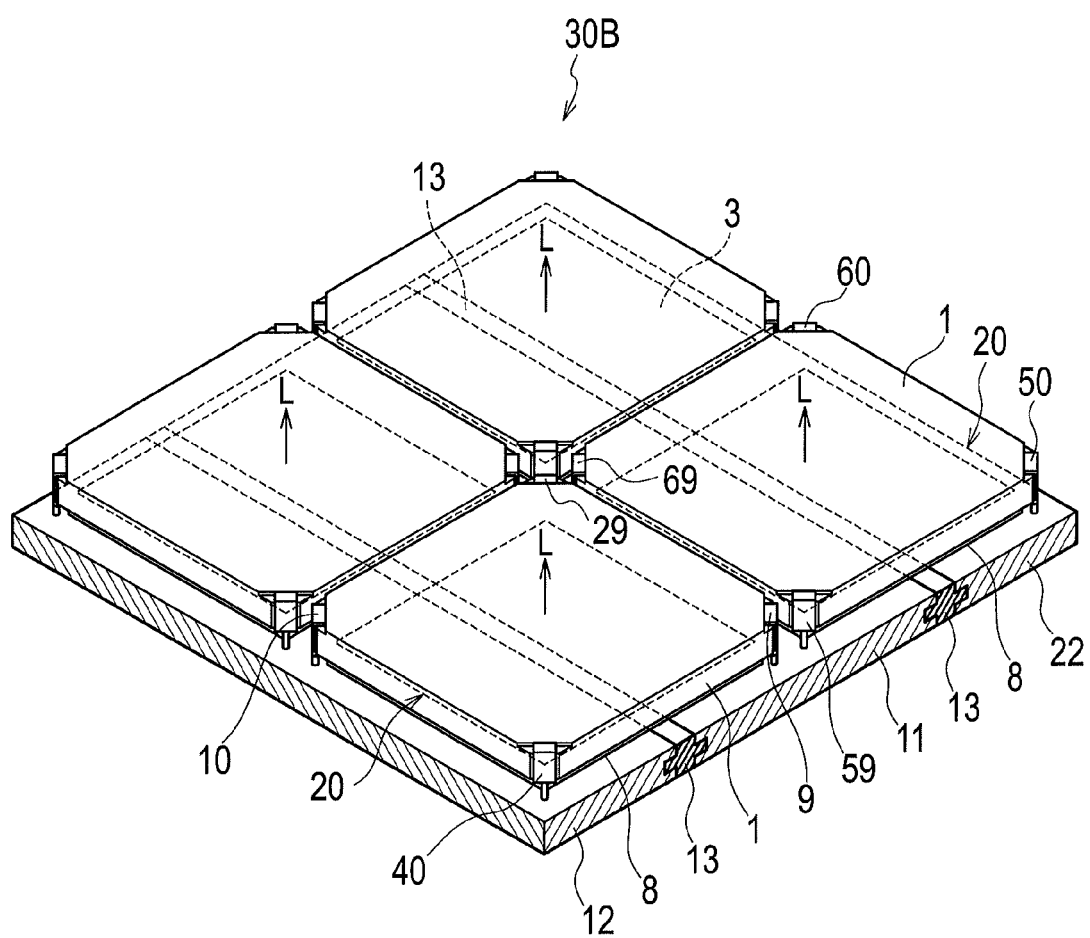
FIG. 6 is a schematic partially cutaway perspective view of an organic light emitting device according to a third embodiment of the present invention.
Figure 7:
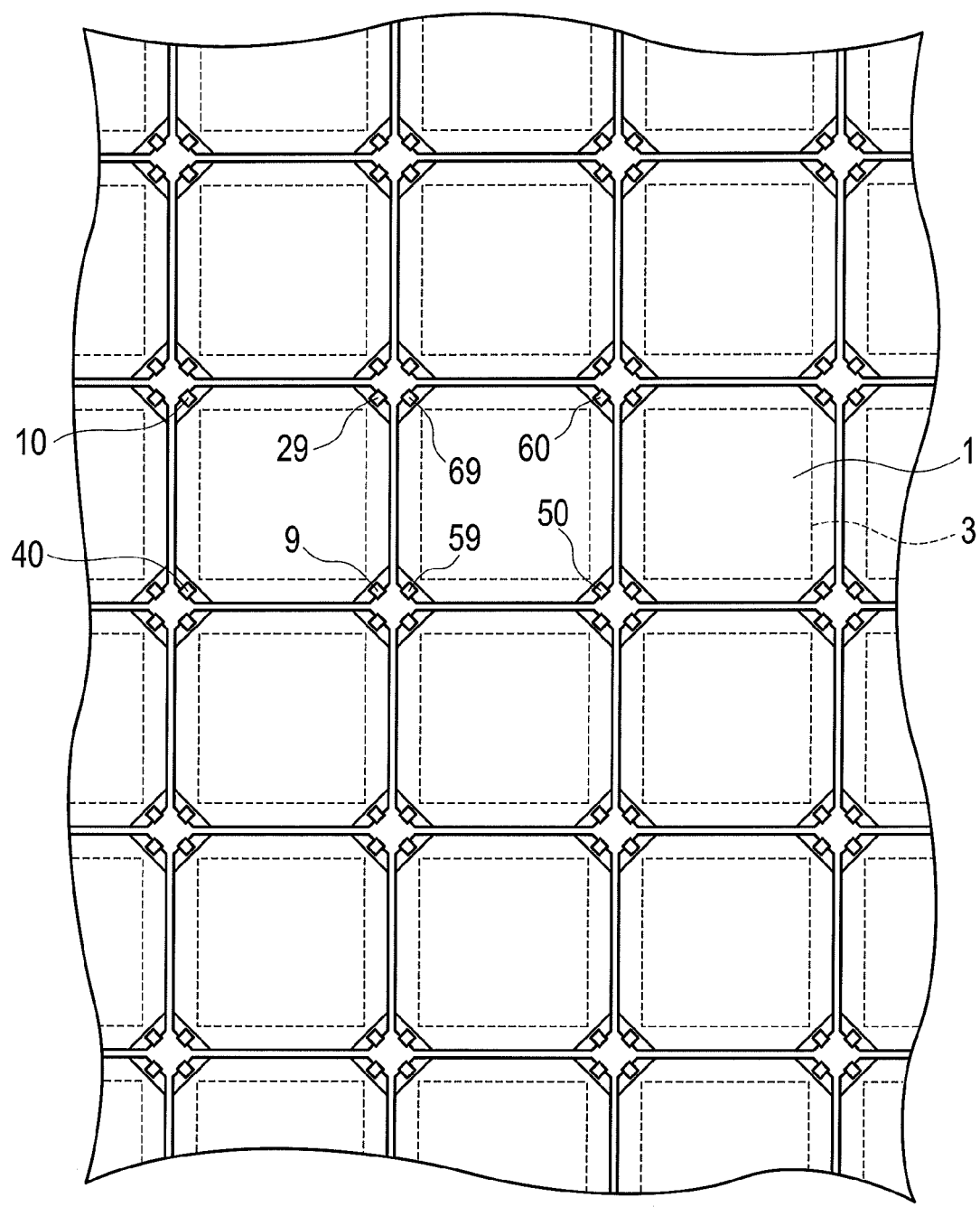
FIG. 7 is a plan view of FIG. 6.

As shown in FIGS. 6 and 7, an organic light emitting device according to a third embodiment of the present invention includes the organic light emitting element 20, the electrode substrate (11, 12), and the lead pin (9, 10). The electrode substrate (11, 12) includes the pin connection hole (14, 15) with which the organic light emitting element 20 is fixed and electrically connected. The lead pin (9, 10) has the clamp portion (9a, 10a) and the insertion portion (9b, 10b). The clamp portion (9a, 10a) clamps peripheral portions of the organic light emitting element 20. The insertion portion (9b, 10b) is fitted into the pin connection hole (14, 15), to thereby connect the organic light emitting element 20 to the electrode substrate (11, 12). In the organic light emitting device, the multiple electrode substrates (11, 12) are joined to each other side by side with the insulating layers 13 interposed therebetween. The multiple organic light emitting elements 20 are disposed adjacent to each other on main surfaces of the thus joined electrode substrates (11, 12). Arrangement of other components is the same as that in the first embodiment, and description thereof is omitted.

According to the third embodiment, the electrode substrates (11, 12) are extended in a planar direction, and the multiple organic light emitting elements 20 are disposed adjacent to each other on the electrode substrates (11, 12). Thus, a structure is formed which is an assembly unit of organic light emitting surface light sources, the assembly unit appearing to be an optically continuous surface light emitter.

Specifically, as shown in FIGS. 6 and 7, the anode substrates 11 and the cathode substrates 12 are disposed alternately with the insulating layers 13 interposed therebetween, and multiple organic light emitting elements 20 are disposed adjacent to each other on the electrode substrates (11, 12).

For example, as shown in FIG. 6, a cathode side lead pin (10, 40) provided on two vertices in one side of one organic light emitting element 20 is fixed to one cathode electrode substrate 12, whereas an anode side lead pin (9, 29) provided on two vertices in the other side thereof is fixed to one anode electrode substrate 11. Meanwhile, an anode side lead pin (59, 69) provided on two vertices in one side of another organic light emitting element 20 adjacent to the one organic light emitting element 20 is fixed to the one anode electrode substrate 11, whereas a cathode side lead pin (50, 60) provided on two vertices in the other side thereof are fixed to another cathode electrode substrate 22. The assembly unit is structured by repeatedly disposing the organic light emitting elements 20 in a direction in which the electrode substrates (11, 12) are arranged adjacent to each other, and in a longitudinal direction of each of the electrode substrates (11, 12).

A method of producing the organic light emitting device according to the third embodiment is the same as the production method of the first embodiment, except that the multiple organic light emitting elements 20 are disposed on the electrode substrates (11, 12). Accordingly, overlapping description is omitted.

In the method of producing the organic light emitting device according to the third embodiment, an organic light emitting device 30B can be produced as follows. Specifically, the anode electrode substrates 11 and the cathode electrode substrates 12 are alternately bonded to each other with insulating layers 13 interposed therebetween. Next, the multiple pin connection holes (14, 15) are formed in the electrode substrates (11, 12) at predetermined positions in a longitudinal direction thereof by etching or the like. Next, the multiple organic light emitting elements 20 are disposed, while being connected with pins.

According to the third embodiment, the multiple organic light emitting elements 20 form a single lighting or light emitting device. Accordingly, the layout or ratios of emission colors of the organic light emitting elements 20 can be selected freely. In other words, color tones for lighting can be changed freely. For example, it is possible to achieve white illumination by alternately arranging red, blue and green, and it is also possible to achieve colors and designs like neon signs, and further to achieve character expression or the like.

Moreover, the shape or size of the assembly unit can be selected freely. Accordingly, it is possible to form, for example, a lighting device having a curved surface.

Moreover, in electrically connecting the organic light emitting elements 20 to the electrode substrates (11, 12), the layout of the electric connection can be selected freely from a serial layout, a parallel layout, an opposing layout and the like. Accordingly, the drive voltage can be changed easily.

The organic light emitting device according to the third embodiment of the present invention makes it possible to provide the organic light emitting device 30 having a simple structure and enabling cost reduction.

Fourth Embodiment

Figure 8:
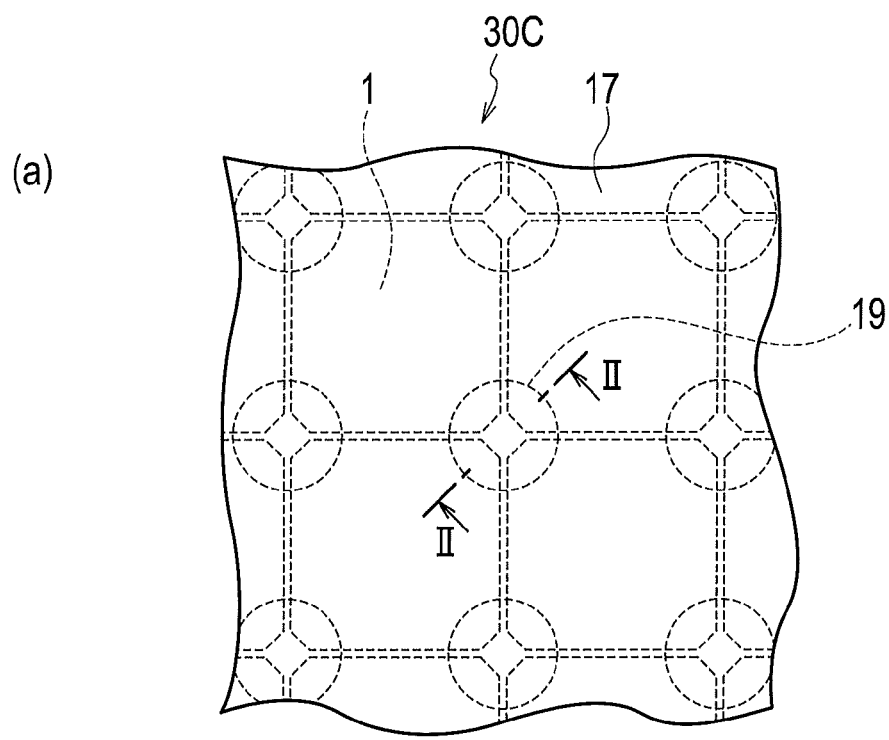
FIG. 8 is a view illustrating an organic light emitting device according to a fourth embodiment of the present invention, where: (a) is a plan view; and (b) is a sectional structural view taken along the II-II line in (a).
Figure 8:
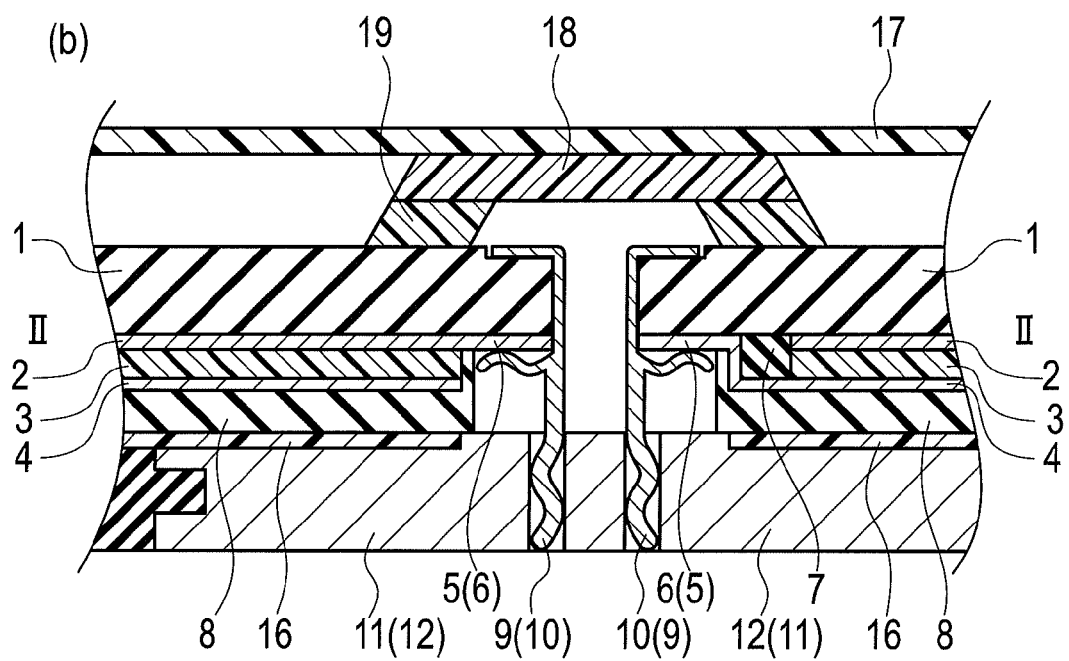
Figure 9:
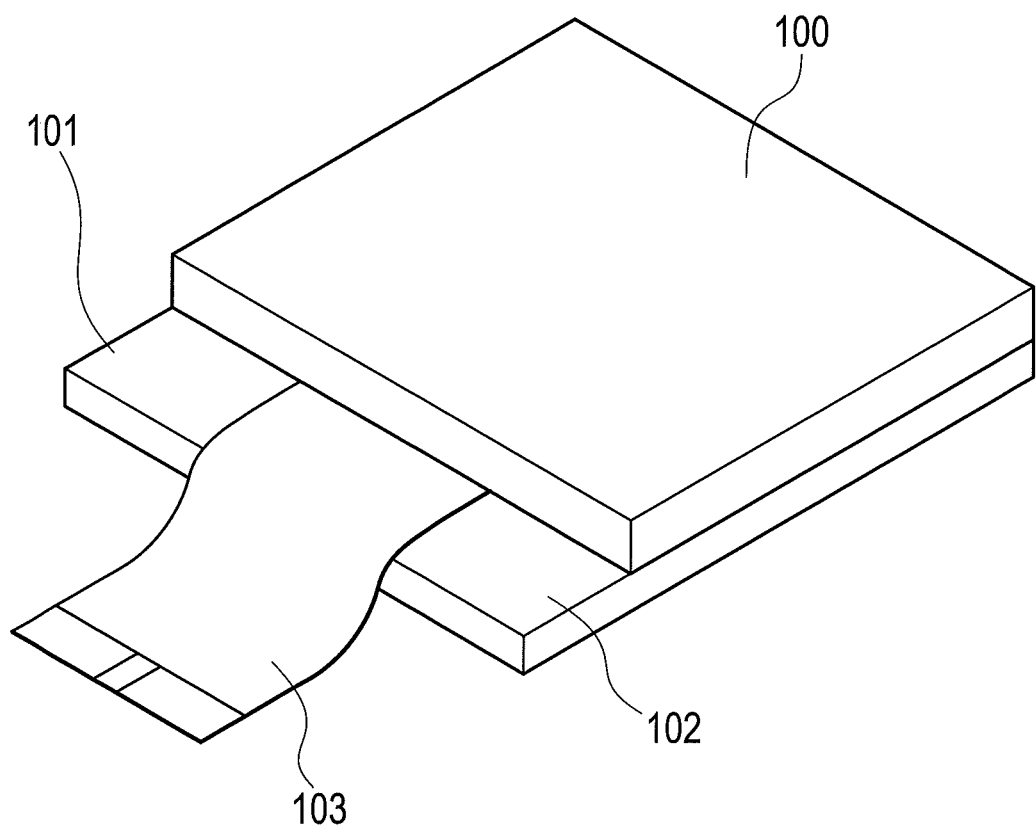
FIG. 9 is a schematic sectional structural view of a conventional organic light emitting lighting panel.

As shown in FIG. 8, an organic light emitting device according to a fourth embodiment of the present invention includes the organic light emitting element 20, the electrode substrate (11, 12) and the lead pin (9, 10). The electrode substrate (11, 12) includes the pin connection hole (14, 15) with which the organic light emitting element 20 is fixed and electrically connected. The lead pin (9, 10) has the clamp portion (9a, 10a) and the insertion portion (9b, 10b). The clamp portion (9a, 10a) clamps peripheral portions of the organic light emitting element 20. The insertion portion (9b, 10b) is fitted into a pin connection hole (14, 15), to thereby connect the organic light emitting element 20 to the electrode substrate (11, 12). In the organic light emitting device, the multiple electrode substrates (11, 12) are joined to each other side by side with the insulating layers 13 interposed therebetween. The multiple organic light emitting elements 20 are disposed adjacent to each other on main surfaces of the thus joined electrode substrates (11, 12). This organic light emitting device further includes: light guide members (18, 19) disposed above boundary regions between organic light emitting elements 20; and a light-diffusing sheet 17 disposed to cover the organic light emitting elements 20 with the light guide members (18, 19) interposed therebetween. Arrangement of other components is the same as that in the first embodiment, and description thereof is omitted.

According to the fourth embodiment, each of the light guide members (18, 19) is disposed on the surface in a vicinity of adjacent vertices of four organic light emitting elements 20 adjacent to each other in such a manner as to cover a portion above a corresponding one of the boundary regions (non-emitting regions) between the multiple organic light emitting elements 20 disposed on the electrode substrates (11, 12), as shown in FIGS. 8(a) and 8(b).

Each of the light guide members (18, 19) includes a prism portion 19 in one side thereof contacting the substrate 1, and a diffusion portion 18 disposed on one side of the prism portion, the one side not facing the substrate 1. Light emitted from vicinities of adjacent vertices of the light emitting portions of the organic light emitting elements 20 is condensed by the prism portions 19. The condensed light exits through the diffusion portions 18 to the outside of the substrate 1.

A shape of the light guide member (18, 19) may be a circular truncated cone shape or a prismoid shape, and is preferably a circular truncated cone shape. Here, a bottom surface of the light guide member (18, 19), which faces the substrate 1, is referred to as a lower bottom portion, and a bottom surface opposite from the lower bottom portion is referred to as an upper bottom portion. In such a case, a diameter of the lower bottom portion is 5 to 10 mm, and a diameter of the upper bottom portion is 3 to 7 mm. The thickness of each of the prism portion 19 and diffusion portion 18 is 0.1 to 2 mm.

Moreover, a concave portion having a circular truncated cone shape is formed at the center of the lower bottom portion of the light guide member (18, 19) as a space for accommodating lead pins (9, 10).

An inclination angle of the light guide member (18, 19) with respect to the surfaces of the organic light emitting elements 20 is 30 to 75°, preferably, 40 to 65°. If the inclination angle is within the above range, light emitted from the vicinities of the adjacent vertices of the light emitting portions of the organic light emitting elements 20 can be condensed effectively on the boundary regions between the organic light emitting elements 20.

The prism portion 19 is preferably made of a material having a higher refractive index than the substrate 1. Examples of the material include acrylic-based resin, vinyl chloride-based resin and the like.

The diffusion portion 18 is preferably made of a material similar to that of the prism portion 19. Further preferably, the diffusion portion 18 has a haze, where a haze value is preferably 5 to 30%, more preferably, 10 to 20%.

According to the fourth embodiment, the light-diffusing sheet 17 is disposed on surfaces of the diffusion portions 18 to cover the organic light emitting elements 20, as shown in FIGS. 8(a) and 8(b).

Examples of a material of the light-diffusing sheet 17 include acrylic-based resin, vinyl chloride-based resin and the like. A haze value of the material is preferably 5 to 30%, more preferably, 10 to 20%.

A method of producing the organic light emitting device according to the fourth embodiment is the same as the production method of the third embodiment, except that the light guide members (18, 19) are disposed on the surfaces of the organic light emitting elements 20, and further, that the light-diffusing sheet 17 is disposed. Accordingly, overlapping description is omitted.

In the method of producing the organic light emitting device according to the fourth embodiment, an organic light emitting device 30C can be formed as follows. Specifically, each of the light guide members (18, 19) is disposed on the surface in a vicinity of adjacent vertices of four organic light emitting elements 20 adjacent to each other in such a manner as to cover the portion above a corresponding one of the boundary regions between the organic light emitting elements 20. Next, the light-diffusing sheet 17 is disposed on the light guide members (18, 19), and the light guide members (18, 19) are fixed by being sandwiched between the organic light emitting elements 20 and the light-diffusing sheet 17.

According to the fourth embodiment, the light guide members (18, 19) are disposed above the boundary regions between the organic light emitting elements 20, and further the light-diffusing sheet is disposed thereon. Hence, an optically seamless (no seam) lighting or light emitting device can be obtained.

Moreover, the light guide members (18, 19) are fixed by being sandwiched between the light-diffusing sheet 17 and the organic light emitting elements 20. Hence, the organic light emitting elements 20 can easily be replaced or detached.

The organic light emitting device according to the fourth embodiment of the present invention makes it possible to provide an organic light emitting device 30C having a simple structure and enabling cost reduction.

Other Embodiment

As described above, the details of the present invention have been disclosed by using the first to fourth embodiments of the present invention. Those skilled in the art can easily understand that the present invention is not limited to the first to fourth embodiments described herein. The present invention can be implemented as modified and altered embodiments without departing from the spirit and scope of the invention defined by the description of the claims. Accordingly, the description herein is for illustration purposes only, and is not intended to limit the present invention. Hereinafter, altered embodiments obtained by partially altering the above-described first to fourth embodiments are described.

For example, it is possible to change the size such as the thickness or the constituent material of each of the layers.

In the above description of the organic light emitting device according to the first embodiment, a configuration is described where the organic light emitting element 20 is clamped by the lead pin (9, 10); however, more secure fixation may be provided by covering the clamp portion (9a, 10a) of the lead pin (9, 10) with a resin or the like.

Moreover, in the above description of the organic light emitting device according to the first embodiment, a configuration is described where the organic light emitting element 20 is fixed and electrically connected to the electrode substrate (11, 12) with the lead pin (9, 10) and the lead pin (29, 40); however, it is also possible to establish no electrical connection with the lead pin (29, 40).

In the above description of the organic light emitting device according to the fourth embodiment, a configuration is described where the light guide members (18, 19) are fixed by being sandwiched between the light-diffusing sheet 17 and the organic light emitting elements 20; however, the light-diffusing sheet 17 may be bonded to the light guide members (18, 19) with an adhesive resin or the like. Moreover, the light guide members (18, 19) may be bonded to the organic light emitting elements 20 with an adhesive resin or the like.

In the above description of the organic light emitting device according to the fourth embodiment, a configuration is described where the light-diffusing sheet 17 is disposed on the light guide members (18, 19); however, a glass plate or a plate of acrylic resin or the like may be disposed instead of the light-diffusing sheet 17. Moreover, it is also possible not to use the light-diffusing sheet 17.

The invention claimed is:

1. An organic light emitting device comprising:
   an organic light emitting element having a substantially rectangular shape in a plan view;
   an electrode substrate including a pin connection hole with which the organic light emitting element is fixed and electrically connected; and
   an anode side lead pin and a cathode side lead pin having a clamp portion and an insertion portion, the clamp portion clamping a peripheral portion of the organic light emitting element, the insertion portion being fitted into the pin connection hole to thereby connect the organic light emitting element to the electrode substrate, and
   the anode side lead pin and the cathode side lead pin are disposed on each of at least two vertices on a diagonal of the rectangular shape.

2. The organic light emitting device according to claim 1, wherein the organic light emitting element is detachably attached to the pin connection hole with the insertion portion.

3. The organic light emitting device according to claim 1, wherein the lead pin is made of an electrically conductive elastic member.

4. The organic light emitting device according to claim 1, further comprising a heat conductive member disposed between the organic light emitting element and the electrode substrate.

5. The organic light emitting device according to claim 1, wherein
   a plurality of the electrode substrates are joined to each other side by side with insulating layers interposed therebetween, and
   a plurality of the organic light emitting elements are disposed adjacent to each other on main surfaces of the electrode substrates thus joined to each other.

6. The organic light emitting device according to claim 5, further comprising:
   a light guide member disposed above a boundary region between the organic light emitting elements; and
   a light-diffusing sheet disposed to cover the organic light emitting elements with the light guide member interposed therebetween.

7. The organic light emitting device according to claim 1, wherein
   the anode side lead pins and the cathode side lead pins are disposed on each of four vertices of the rectangular shape.

8. The organic light emitting device according to claim 7, wherein
   a plurality of the electrode substrates are joined to each other side by side with an insulating layer interposed therebetween,
   the same polar side lead pins of the anode side lead pins and the cathode side lead pins are arranged on one side of the rectangular shape across the insulating layer in a plan view.

* * * * *